US006882731B2

(12) United States Patent
Irwan et al.

(10) Patent No.: US 6,882,731 B2
(45) Date of Patent: Apr. 19, 2005

(54) MULTI-CHANNEL AUDIO CONVERTER

(75) Inventors: Roy Irwan, Eindhoven (NL); Ronaldus Maria Aarts, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 504 days.

(21) Appl. No.: 10/023,399

(22) Filed: Dec. 13, 2001

(65) Prior Publication Data

US 2002/0118840 A1 Aug. 29, 2002

(30) Foreign Application Priority Data

Dec. 22, 2000 (EP) ........................................... 00204783

(51) Int. Cl.[7] ........................... H04R 5/00; H03G 5/00
(52) U.S. Cl. ........................................... 381/18; 381/98
(58) Field of Search ............................ 381/98, 18, 12, 381/307, 20, 19; 434/307 A

(56) References Cited

U.S. PATENT DOCUMENTS 5,796,844 A * 8/1998 Griesinger .................. 381/18
6,496,584 B1 * 12/2002 Irwan et al. .................. 381/18

FOREIGN PATENT DOCUMENTS

EP 0757506 A2 2/1997 ............ H04S/3/00

* cited by examiner

*Primary Examiner*—Forester W. Isen
*Assistant Examiner*—Elizabeth McChesney
(74) *Attorney, Agent, or Firm*—Edward W. Goodman

(57) ABSTRACT

A method and audio converter for generating further audio signals ($u$, $u_l$, $u_r$, $u_c$, $u_s$) from initial audio signal ($x$, $x_l$, $x_r$), wherein optionally an information signal (in means 23) is derived from said initial audio signals (x). On basis of the initial audio signal ($x$, $x_r$, $x_l$), a dominant signal y(k) and a residue signal (or signals) q(k), substantially transverse to each other, are determined (means 21 and 22). In at least two frequency ranges frequency components of the dominant signal are analysed (means 24), and a difference signal $y_r$ ({$y(k)-y_b(k)$) corresponding to the dominant signal minus a frequency range component of the dominant signal in one or more frequency ranges ($y_b(k)$) is formed. The difference audio signal $y_r$ and the residue signal q(k) are transformed into said further audio signal u(means 25), i.e.

$$u = T\begin{pmatrix} y_r(k) \\ q(k) \end{pmatrix}.$$

Preferably in said means (25) the frequency range component is also transformed differently from the difference signal $y_r$, $$\underline{u} = T\begin{pmatrix} y_r(k) \\ q(k) \end{pmatrix} + M\begin{pmatrix} y_b(k) \\ q(k) \end{pmatrix},$$

with TγM.

9 Claims, 5 Drawing Sheets

MULTI-CHANNEL AUDIO CONVERTER

PRIOR ART DESCRIPTION

The present invention relates to a multi-channel audio converter, comprising means for generating an audio signal from initial audio signals and means for transforming the initial audio signals (x) to further audio signals (u).

The present invention also relates to a method for generating audio signals from initial audio signals (x), wherein an information signal is derived from said initial audio signals (x) and used for transforming said initial audio signals (x) to said further audio signals (u).

Such a multi-channel stereo system and method are known from EP-A-0 757 506. The known system is a so-called karaoke system, in which system use is made of surround channels which have been embedded in the recording medium during the encoding process.

It is a disadvantage of the known system and method that the known system and method requires a specialized method for encoding and decoding. The system does not operate on existing CD's unless they have been encodes specifically for the known system.

Therefore it is an object of the present invention to provide a system and corresponding method capable of handling existing audio carriers, such as CD's, enabling the users to be interactive with the recorded audio signal.

SUMMARY OF THE INVENTION

Thereto the multi-channel converter according to the invention is characterized in that the transforming means comprise determining means for determining on basis of the initial audio signal (x), a dominant signal (y(k)) and one or more residue signals (q(k)), substantially transverse to each other, analyzing means for analyzing frequency components of the dominant signal in at least two frequency ranges, means for forming a difference audio signal ($y_r${y(k)−$y_B$(k)) corresponding to the dominant signal (y(k)) minus a frequency range component of the dominant signal in one or more of the frequency ranges ($y_B$(k)), and means for transforming the difference audio signal ($y_r$) and the residue signal q(k) into said further audio signals (u).

The transforming means in accordance with the invention comprise means for determining a dominant signal on basis of the initial audio signals. Very often these initial signals will be comprised of two signals, a left ($x_l$) and right ($x_r$) signal, i.e. stereophonic signals. The invention is, however, not restricted to a system utilizing only two initial stereophonic signals, the initial recording may comprise more than two initial signals (e.g. a left, right, center ($x_c$) and surround ($x_s$) signal or even more complex signals). On basis of the initial audio signals a dominant signal (y(k)) is determined as well as one or more residue signals (q(k)). The dominant direction is thereby determined. The dominant signal can e.g. be found by defining y(k) as a linear combination of the initial signals $y(k)=\Sigma w_i\, x_i(k)$ where $w_i$ is a weight factor and □$w_i$=1. Maximizing the energy $E(y^2(k))$ will give the dominant signal. The remaining signal(s) is (are) the residue signals. Several methods are known for performing this operation.

Alternatively the weight factors $w_i$ ($w_r$, $w_l$, possibly also $w_s$,$w_c$) can be preset, in which case the dominant signal y (k) is determined by the relative intensity of the different initial audio signals. In yet another alternative the weight factors may be chosen interactively by the user, in which case the user determines the dominant direction or dominant signal. In all cases a dominant signal is produced on basis of the initial signals as well as a residue signal or signals.

In a next step the frequency content of the dominant signal is analyzed, wherein at least two frequency ranges are distinguished. Each of these ranges comprises certain musical information. At least one signal, corresponding to the dominant signal (y) minus the frequency component of said dominant signal within a particular frequency range ($y_b$) is made, and other signal(s) corresponding to remaining part(s) of the frequency spectrum are preferably also made. The particular frequency range may be for instance all frequencies above or below a specific frequency, but is preferably a frequency band. In subsequent transformation of these signals the transformation matrix is different for the different signals. In a simple embodiment three frequency ranges are distinguished, a lower, middle and a higher frequency range, and the particular frequency range is a middle range, i.e. a frequency band. To put it simply, in such a simple embodiment a middle frequency range is cut out from the dominant signal. Preferably a band reject filter is used, i.e. only a middle part of the frequency spectrum is cut out. This cuts out from the dominant signal most of the vocal energy, thus allowing 'karaoke' in the classical sense of the word, i.e. most of the vocal energy is cut out from the reproduced sound, or in other words the transformation matrix for the frequency range dominant signal ($y_b$(k)) is 0. In such simple embodiments only the difference signal is transformed. The inventors have found that devices in accordance with the invention enable good 'karaoke' for virtually any recording.

Preferably the transforming means comprise means for forming a frequency range dominant signal ($y_b$(k)) corresponding to said frequency range component of the dominant signal ($y_b$(k)), and means for transforming the difference audio signal ($y_r${y(k)−$y_b$(k)), as well as the frequency range dominant signal ($y_b$(k)) and the residue signal q(k) into said further audio signals ($u_l$, $u_r$, $u_c$, $u_s$), the transformation matrix being different for the difference audio signal ($y_r${y(k)−$y_b$(k)) than for the frequency range dominant signal ($y_b$(k)). One method of forming $y_r$ is by applying a band reject filter to the dominant signal y(k). Rather than completely eliminating a frequency component of the dominant signal as in a 'pure karaoke' mode, in these embodiments of the invention said frequency range dominant signal ($y_b$(k)) is transformed, different from the difference signal ($y_r${y(k)−$y_b$(k)). This enables the information present in said signal $y_b$(k) to be manipulated, e.g. to 'move' the singer from centre stage to a side position.

Preferably the audio converter comprises means for deriving from the initial signal x an information signal and means for deriving from the information signal coefficients for the transformation of the difference audio signal ($y_r${y(k)−$y_b$(k)).

In even more sophisticated and preferred embodiments of the invention, the transformation means comprise means for interactively influencing the transformation matrix of the frequency range dominant signal ($y_b$(k)). In such preferred embodiments the overall gain of the transformation and/or the position of the apparent source due to the transformation of the frequency range dominant signal ($y_b$(k)) can be influenced by the user. This enables the user to interactively manipulate the signal, e.g. to 'sing along' with a singer as well as to reposition a singer to the side allowing the user to take center stage him/herself. In order to do so the means for transforming comprise means for influencing the transformation matrix for the frequency range dominant signal $y_b$(k).

The particular frequency range is preferably between 300 Hz and 4.5 kHz.

SHORT DESCRIPTION OF THE DRAWINGS

At present the multi-channel stereo converter and corresponding method according to the invention will be elucidated further together with their additional advantages while reference is being made to the appended drawing, wherein similar components are being referred to by means of the same reference numerals. In the drawing.

DETAILED DESCRIPTION OF PREFERRED EMBODIMENTS

Figure 1:
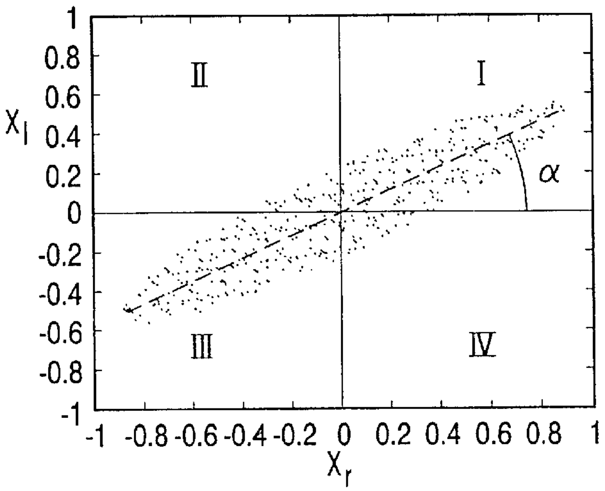
FIG. 1 shows a two dimensional state area defined by a combination of left ($x_l$) and right ($x_r$) audio signal amplitudes for explaining part of the operation of the multi-channel audio converter according to the present invention.

FIG. 1 shows a plot of a two-dimensional so called state area (Lissajous figure) defined by momentaneous left ($x_l$) and right ($x_r$) audio signal amplitudes. Along the vertical axis input signal values of a left ($x_l$) audio (in this example stereo) signal are denoted, while along the horizontal axis input signal values of a right ($x_r$) audio signal are denoted. Stereo music leads to numerous samples shown as dots in the area. The dotted area may have an oblong shape as shown, oriented at an angle $\alpha$. The angle $\alpha$ can be seen to have been formed by some average over all dots in the area providing information about a direction of a dominant signal. There are several estimation techniques known to estimate the dominant direction. The least square method is well known to provide an adequate direction sensing or localization algorithm. Orthogonal to a dominant signal y one may define the a residue signal or signals q, which provide(s) information about a audio signals transverse to the dominant signal y.

Figure 2:
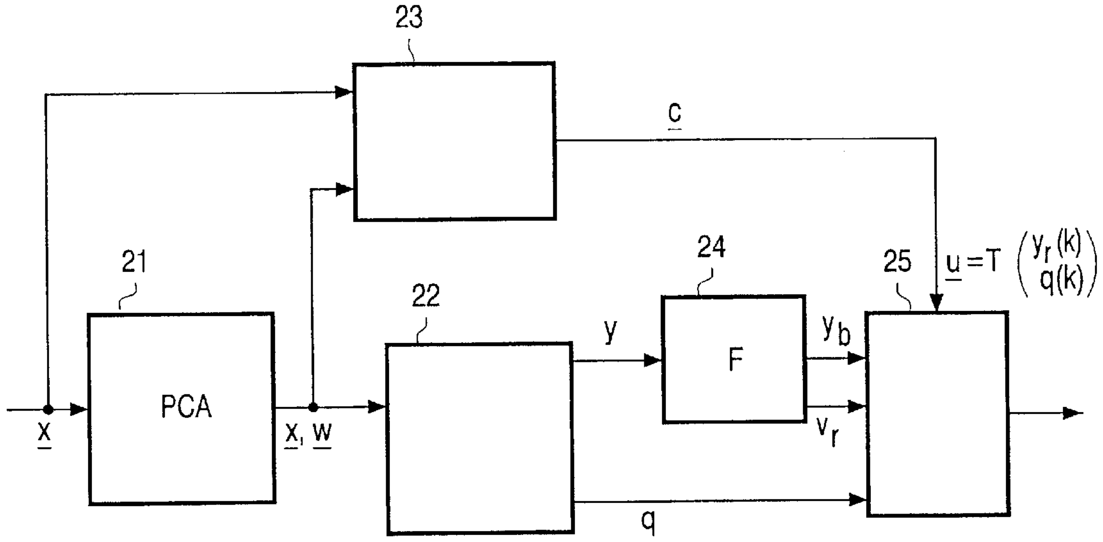
FIG. 2 shows a general circuit for a multi-channel audio converter in accordance with the invention.

FIG. 2 shows a general circuit for a multi-cannel audio converter in accordance with the invention. An initial signal x is sent to a determining means 21 which may be a dedicated circuit or some software for performing the same function for determining the dominant direction, e.g. by determining the weight factors w as explained below. These data on x and w are sent to a means 23 which determines coefficients c which are sent to means 25. The means 22 determine the dominant signal y and the residue signal(s) q. The dominant signal y is filtered by filtering means 24 (F). Giving a signal $y_r$ (i.e. the dominant signal minus a frequency component of said dominant signal) and optionally a signal $y_b$ corresponding to the said frequency component. In means 25 a mapping is performed in which the vector ($y_r$, q) is multiplied by a transformation matrix T (dependent on coefficient c) to give a vector u.

Figure 3:
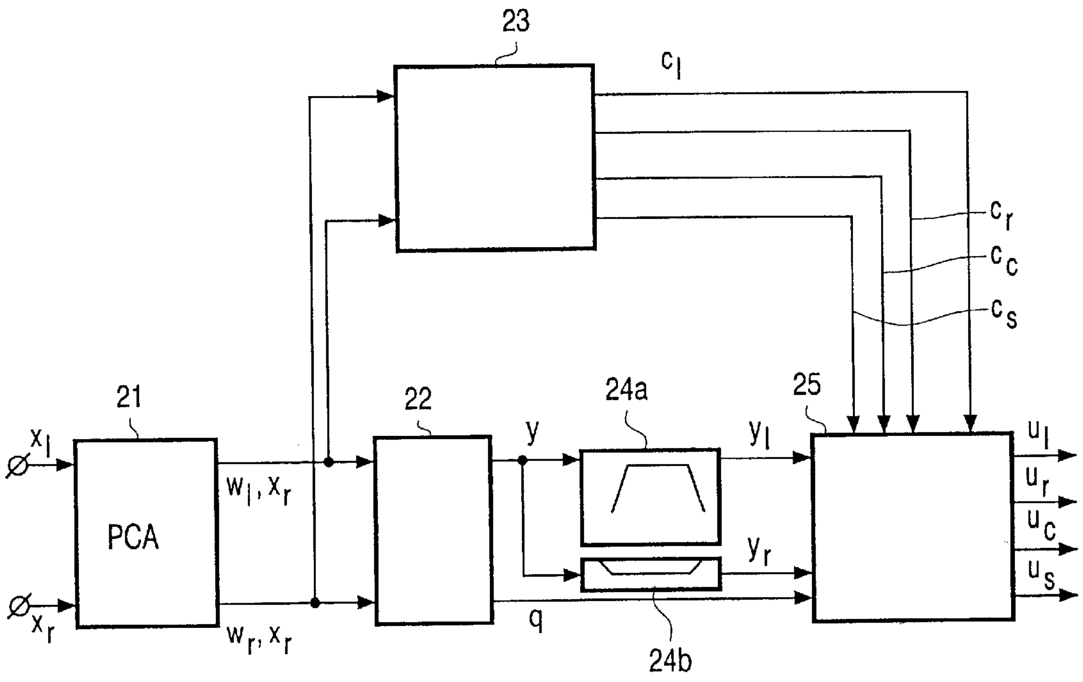
FIG. 3 shows a general outline of several embodiments of the multi-channel audio converter according to the invention.

FIG. 3 shows a combination of several possible embodiments of a multi-channel audio converter 1. The converter 1 comprises means 21 for determining the dominant direction for the signal, a.o. weight factors $w_l$ and $w_r$. These weight factors indicate the direction of the dominant signal. The weight factors may be deduced using some averaging method as described above, or alternatively be preset, or yet alternatively be interactively determinable by the user (see also FIG. 8). Data are produced corresponding to $w_l$, $x_l$ and $w_r$, $x_r$. These data are then transformated in means 22 to produce a dominant signal y and a residue signal (or signals) q, which are substantially transverse to each other. When the initial signal x is comprised of two signals $x_l$ and $x_r$ this transformation amounts to a rotation of the coordinate system and can be described by $$y(k)=w_l(k)x_l(k)+w_r(k)x_r(k)$$

$$q(k)=w_r(k)x_l(k)-w_l(k)x_r(k).$$

The signal y(k) is frequency analyzed in means 25 and a difference signal $y_r\{y-y_B$ is produced as well as (in embodiments) a signal $y_b$. Signal $y_b$ corresponds to the frequency component of the dominant signal y within one or more frequency ranges. The { symbol is used to indicate that $y_r$ and $y_b$ are approximately complementary. However, e.g. when using filters (band reject for $y_r$ and band pass for $y_b$) a perfect match is only in ideal cases achievable, in reality using two filters will introduce some non-complementariness. These signals $y_r$ and $y_b$ are in matrix multiplication means 25 transformed into final audio signals $u_l$, $u_r$, $u_c$ and $u_s$. The data $x_r$, $w_r$, $x_l$, $w_l$ are in this preferred embodiment furthermore sent to an used in means 23 to provide transformation coefficients $c_l$, $c_r$, $c_c$ and $c_s$ used in transformation means 25, more in particular for transformation matrix T (see below). This is a preferred embodiment although coefficients $c_l$, $c_r$, $c_c$ and $c_s$ could be determined by other means or preset.

Figure 4:
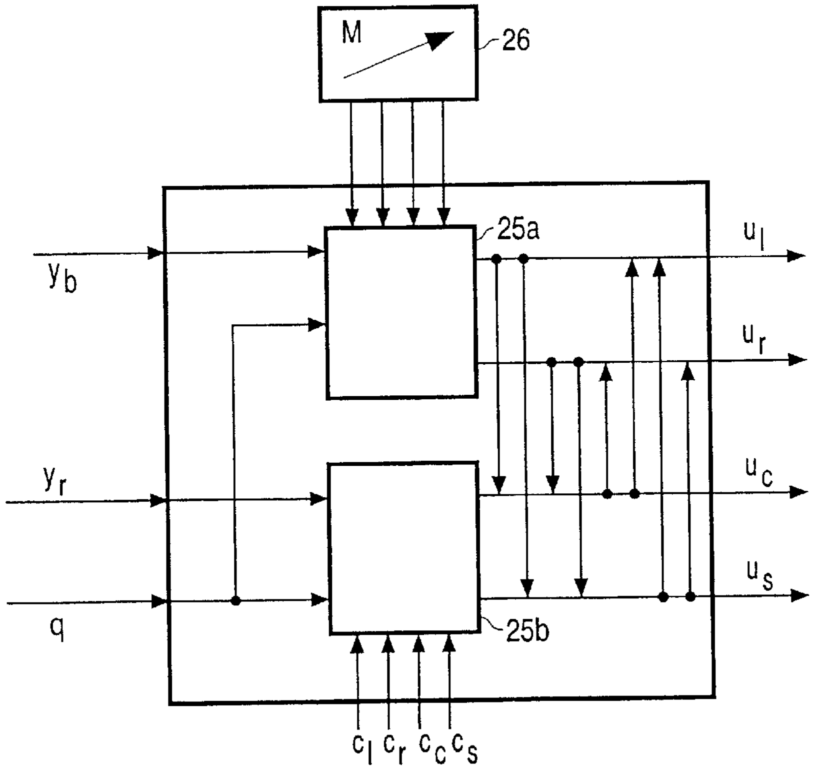
FIG. 4 shows more in detail an embodiment of an audio converter according to the invention FIGS. 5 to 7 outline an example of matrix multiplication usable in generating a surround signal in the multi-channel audio converter according to the invention.

In FIG. 4 the means 25 are schematically shown in more detail. In means 25*a* the frequency range dominant signal $y_b(k)$ and the residue signal q(k) are transformed using a matrix multiplication (or any transformation similar or equivalent to a matrix multiplication, often named 'mapping'). Preferably the coefficients (or at least one coefficient or characteristic of or determinative for said matrix M) are at least partly interactively determinable by the user, as schematically indicated in FIG. 4 by means 26. Such interactive determination may be for instance the apparent intensity (e.g. an overall factor for the matrix multiplication) or the apparent position. In this respect reference is also made to below illustrative examples. The difference signal ($y_f\{y(k)-y_b(k)$)) and the residue signal is transformed in means 25*b* by a different transformation. The two resulting signals are combined, giving signals $u_l$. $u_r$. $u_c$ and $u_s$ as indicated in FIG. 4.

Figure 5:
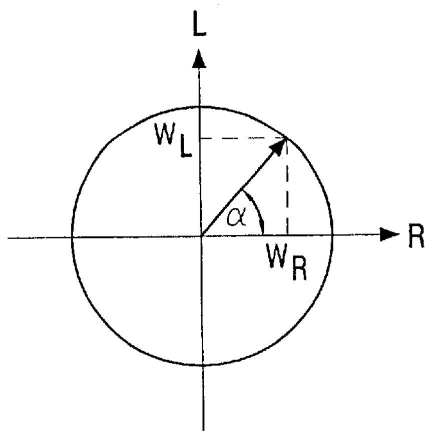
Figure 6:
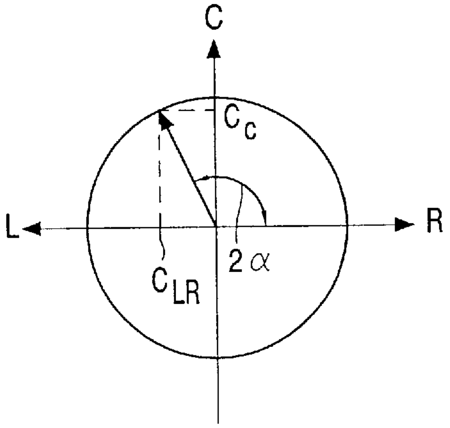
Figure 7:
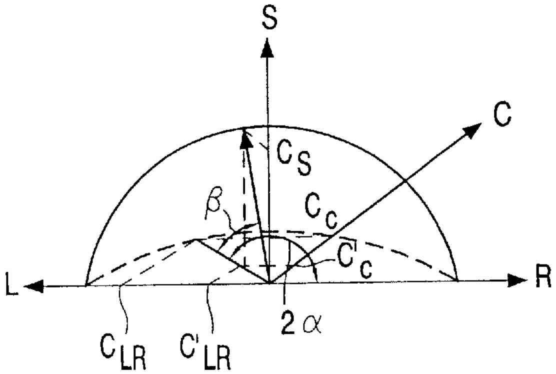

An example of such matrix multiplication T will with reference to FIGS. 5 to 7 now be illustrated.

As explained above the dominant signal can be found by $$y(k)=w_l(k)x_l(k)+w_r(k)x_r(k).$$

The weight $w_l$ and $w_r$ represent a vector with an angle $\alpha$ on a unit circle as schematically shown in FIG. 5. To derive a center channel from the left and right signal, the angle in FIG. 6 is multiplied by a factor 2. It is then possible to find the projections of the resulting vector onto both the horizontal and vertical axes which represent right (R), left (L) and centre (C) channels, respectively, as shown in FIG. 6.

Using goniometric functions, the projection can be worked out to be $$c_c=\sin(2\alpha)=2w_l w_r$$

$$c_{lr}=\cos(2\alpha)=w_r^2-w_l^2$$

It would be intuitively to expand the three channels further to four by utilising the lower part of the circle of FIG. 6. This can be done by simple multiplying α by a factor of four. Although this is possible, FIG. 7 shows an alternative manner of mapping onto four channels (L,R,C,S).

A main goal of a multichannel audio system is to offer ambient effect to the listener(s). These effects can be produced by playing back a combination of in-phase and anti-phase components inherent in input signals. The in-phase components are usually distributed to the front channels, where by contrast the anti-phase components are distributed to surround channel(s). Finding a balance is important for achieving the desired effects.

One way to find this balance is to use a cross-correlation technique for measuring both anti-phase and in-phase components of input signals. This can be expressed by $$\rho=\Sigma(L-\underline{L})(R-\underline{R})/\{\Sigma(L-\underline{L})^2(R-\underline{R})^2\}^{1/2}$$

where the underscores represent average values. The actual measurement or estimation of the cross correlation ρ can take place by any suitable means, and each of these signals can at wish be taken to provide stereo magnitude information.

Having found or calculated the measure of both anti-phase and in-phase components in the input signals, it is left to incorporate said measure into a vector transformation to convert the three channel representation shown in FIG. 6 to a four channel representation keeping in mind that the in-phase components are usually distributed to the L,C and R channels and the anti-phase to the surround channel(s). One way of achieving this is to use a goniometric tool, for instance by defining an angle β, for instance by $$\beta(k)=\arcsin(1-\rho) \text{ for } 0[\rho[1$$

$$\beta(k)=0 \text{ for } \rho<0$$

and lifting the vector shown in FIG. 6 over said angle out of the plane. Having defined this mapping it is possible to compute the projections of the transformed vector onto each axis to obtain $c_s$, $c'_{lr}$, $c'_c$. This is in figure form shown in FIG. 7. Thus for strongly correlated input signals β will be small and therefore most of the signals are distributed into L, R and C channels. On the other hand, when the input signal are only weakly correlated β will be large and the anti-phase components are distributed into the surround channel(s), as expected. This mechanism can be seen from the primes at $c_{lr}$ and $c_c$. When the vector is lifted (i.e. β unequal to zero) the projections of $c_{lr}$ and $c_c$ represented in the figure by $c'_{lr}$ and $c'_c$ become shorter and the more so as β increases. On the other hand if β is zero maximum projection on the horizontal (i.e. L, R, C) plane is achieved. Using these coefficients matrix multiplication of the difference signal and the frequency range signal can be performed.

An example of a possible mapping, known as matrixing, is given in the matrix hereunder, which produces four channel output signals of $u_l$, $u_r$, $u_r$ and $u_s$ representable as a vector u, expressed in terms of time samples k, according to:

$$\underline{u}=\begin{pmatrix}u_l(k)\\u_r(k)\\u_c(k)\\u_s(k)\end{pmatrix}=\begin{pmatrix}c_l(k) & w_r(k)\\c_r(k) & -w_l(k)\\c'_c(k) & 0\\0 & c_s(k)\end{pmatrix}\begin{pmatrix}y_r(k)\\q(k)\end{pmatrix}+M\begin{pmatrix}y_b(k)\\q(k)\end{pmatrix}$$

or in short $$\underline{u}=T\begin{pmatrix}y_r(k)\\q(k)\end{pmatrix}+M\begin{pmatrix}y_b(k)\\q(k)\end{pmatrix}$$

where $$c_l(k)=\begin{cases}-c'_{lr}(k) & \text{if } c'_{lr}<0\\0 & \text{otherwise}\end{cases}$$

$$c_r(k)=\begin{cases}c'_{lr}(k) & \text{if } c'_{lr}\geq 0\\0 & \text{otherwise.}\end{cases}$$

and

M is a matrix which in a simple embodiment is 0, i.e. $y_B(k)$ does not influence at all the end result, or in other words the signal $y_b(k)$ is cut out. This forms a 'pure karaoke mode'. Such an embodiment can be obtained by using a bandstop filter. In more sophisticated embodiments may be e.g.

$$M_1=\begin{pmatrix}c'_c & 0\\0 & 0\\0 & 0\\0 & 0\end{pmatrix}$$

in which case the frequency range dominant signal $y_b(k)$ is transformed into a signal in the left channel.

Likewise the frequency range dominant signal $y_b(k)$ may be transformed into a signal in the right channel using a matrix.

$$M_2=\begin{pmatrix}0 & 0\\c'_c & 0\\0 & 0\\0 & 0\end{pmatrix}$$

The matrix M is thus (in these embodiments) dependent on the channels in which the frequency dominant signals are to be sent. In a preferred embodiment the channel distribution may be set by the user. A simple dial or a combination of simple dials could be used for this purpose, for instance one dial regulating left-right and another one regulating the amount of surround sound.

The strength of the signals may also be regulated or regulatable by multiplication with a strength factor, i.e. an overall factor in front of the actual matrix. Choosing the coefficients of the matrix it is possible to regulate the apparent strength and/or apparent position (by partitioning the signal $y_b(k)$ over the various channel via the matrix) of the signal $y_b(k)$.

In general the matrix coefficients of said matrix transformation could be based on projections of an actual audio signal on principal axes shown in FIG. 7 of the audio signals (R, L, C, S). These matrix coefficients may however at wish be combined with coefficients which are partly determined on an empirical basis.

In general the transformation may be written as $$y(k)=w_l(k)x_l(k)+w_r(k)x_r(k)$$

$$q(k)=w_r(k)x_l(k)-w_l(k)x_r(k).$$

y(k) is herein also called the dominant signal and q(k) the residue signal Where there are more than two initial audio signals $y_b(k)$ is a frequency component of y(k) within a frequency range (also called herein the frequency range dominant signal) and $$\underline{u}=T\begin{pmatrix} y_r(k) \\ q(k) \end{pmatrix}+M\begin{pmatrix} y_b(k) \\ q(k) \end{pmatrix}$$

where u are the further audio signals T is the transformation matrix (which definition includes any mapping operation) for the difference signal $y_r(\{y(k)-y_b(k))$ and the residue signal and M is the transformation matrix for the frequency range dominant signal $y_b(k)$. u may be a vector with two, three, four or more components. M is in the most simple arrangement 0, in which case the frequency range dominant signal $y_b$ is simply cut out. In preferred embodiments there are means for interactively controlling M, e.g. choosing the effective apparent direction and/or magnitude frequency range resonant signal. Means 26 may for instance comprise a simple knob allowing the user to choose a direction, means 25*a* comprising means for translating this chosen direction into the appropriate matrix M for multiplication with the vector $\{y_b(k), q(k)\}$.

Whilst the above has been described with reference to essentially preferred embodiments and best possible modes it will be understood that these embodiments are by no means to be construed as limiting examples of the devices concerned, because various modifications, features and combination of features falling within the scope of the appended claims are now within reach of the skilled person, as explained in the above. In particular in matrix M several further aspects may be incorporated, for instance a pitch change of the signal $y_b(k)$. The relevant frequency range for the frequency range dominant signal $y_b(k)$ is preferably higher than 300 Hz and lower than approximately 4.5 kHz. This leaves most of the low frequency signals, which are for a recording most important for providing a 'spacious sound' impression, unchanged. Likewise cymbals and other high frequency producing instrument which are usually very localized are left unchanged. In preferred embodiments the particular frequency range is tunable. This allows for fine tuning. Prior to the application of the frequency range filter a vocal recognition system may be implemented.

Figure 8:
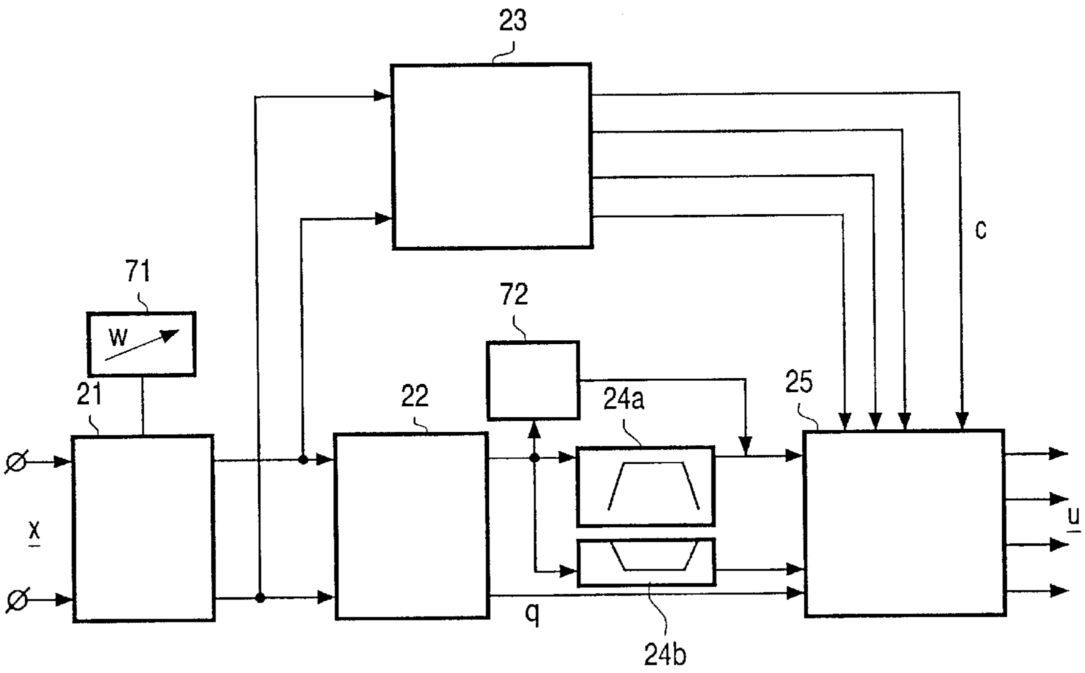
FIG. 8 illustrates a further embodiment of the invention

FIGS. 7 and 8 show a number of possible embodiments of the invention. In the embodiment shown in FIG. 7 two different additional features, which may be used separately are schematically shown. A means 71 is shown, coupled to means 21. By this means the weight factors $w_l$ and $w_r$ may be set, such means can for instance be a dial indicating a direction, where the cosine and the sine of the angle indicated by the dial are the weight factors $w_r$ and $w_l$. In this manner the dominant direction may be interactively set by the user. Furthermore a means 72 is implemented. This means comprises a vocal recognition system. If the vocal recognition system does not recognize the presence of a vocal part, the filter means 24 are by-passed or made inactive. As a result the music is effectively left unchanged if and when no vocals are recognized. This allows for an improved reproduction of those parts of the music in which the singers are silent. This voice recognition system may itself be made dependent on human activity, i.e. there being a switch or any other activation/deactivation means enabling the user to use or not such additional feature. In FIG. 8 the signal $y_b$ is mixed with a signal $y_m$ from a recording device (e.g. a microphone) or in other words $$y'_b=Ay_b+By_m$$

The ratio A/B may be preset or settable by the user. The signal $y_m$ may be first filtered by a filter comparable to the filter in filter means 24.

Figure 9:
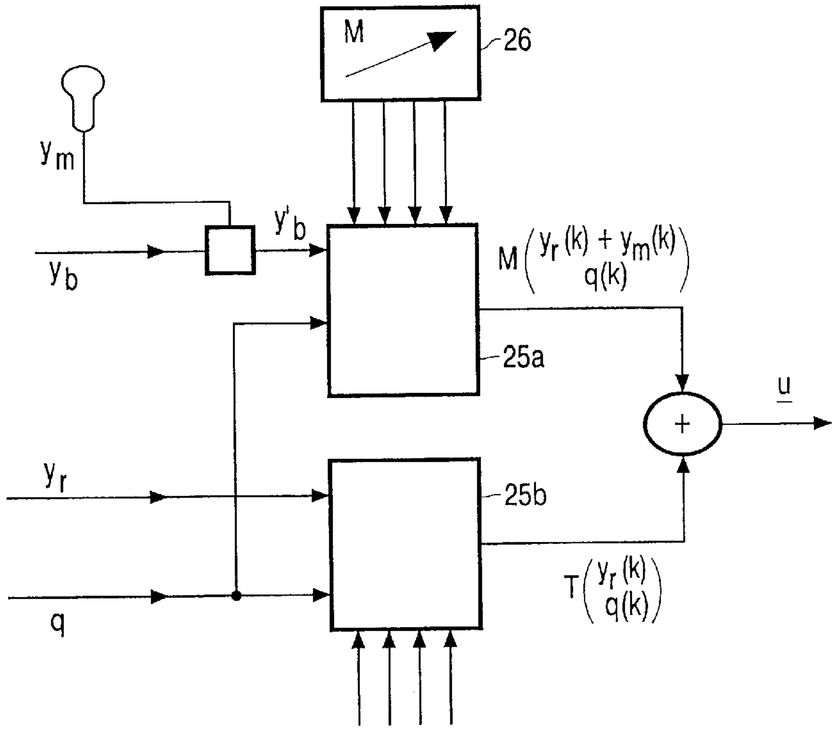
FIG. 9 illustrates yet a further embodiment of the invention.
Figure 10:
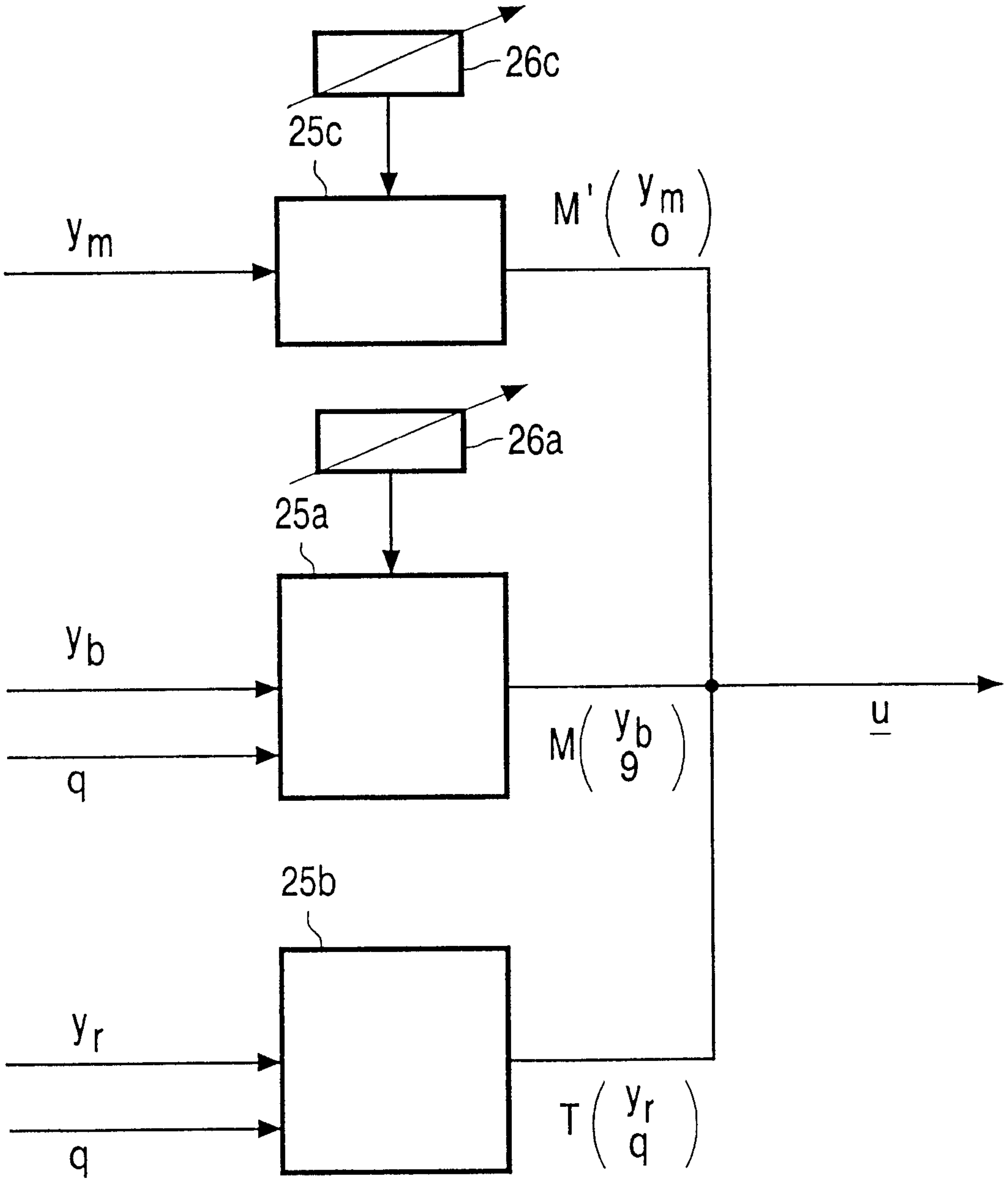
FIG. 10 illustrates a yet further embodiment of the invention

FIG. 9 shows in a yet more sophisticated embodiment of the invention. In this embodiment each of the signal $y_b$ and $y_m$ are separately multiplicated with a matrix which is adjustable in means 26*a* and 26*c*. The total signal u is then:

$$\underline{u}=T\begin{pmatrix} y_r(k) \\ q(k) \end{pmatrix}+M\begin{pmatrix} y_b(k) \\ q(k) \end{pmatrix}+M'\begin{pmatrix} y_m(k) \\ 0 \end{pmatrix}$$

where the coefficients of T, M and/or M' are derived from $w_r$ and $w_l$ and dependable on a choice (direction and/or relative strength) by the user (via means 26*a* and/or 26*c*) For instance a choice of putting the microphone signal in the left channel would mean $$M'=S\begin{pmatrix} 1 & 0 \\ 0 & 0 \\ 0 & 0 \\ 0 & 0 \end{pmatrix},$$

where S is some strength factor; the choice of putting the microphone signal in the right channel would lead to $$M'=S\begin{pmatrix} 0 & 0 \\ 1 & 0 \\ 0 & 0 \\ 0 & 0 \end{pmatrix}$$

This allows the user to position the original singer at one position or to make the singer only heard in surround, and to choose the position of himself/herself at any wanted position. If he/she chooses MγM' he/she can take a position different from the original singer, for instance the original singer to the right and the user to the left.

In short the invention can be described as follows:

In a method and audio converter for generating further audio signals ($u, u_l, u_r, u_c, u_s$) from initial audio signal ($x, x_l, x_r$), wherein optionally an information signal ($c_l, c_{cc}$) (in means 23) is derived from said initial audio signals (x), the initial audio signals (x) are transformed to further audio signals (u). On basis of the initial audio signal $x, x_r, x_l)$, a dominant signal y(k) and a residue signal (or signal) q(k), substantially transverse to each other are determined (in means 21 and 22). In at least two frequency ranges frequency components of the dominant signal are analysed (in means 24), and a difference signal $y_r(\{y(k)-y_b(k))$ corresponding to the dominant signal minus a frequency range component of the dominant signal in one or more frequency ranges ($y_b(k)$) is formed, and the difference audio signal $y_r(\{y(k)-y_b(k))$ and the residue signal q(k) are transformed into said further audio signal (in means 25), i.e.

$$\underline{u} = T\begin{pmatrix} y_r(k) \\ q(k) \end{pmatrix}.$$

Preferably in said means the frequency range component is also transformed differently from the difference signal, i.e. in formula form $$\underline{u} = T\begin{pmatrix} y_r(k) \\ q(k) \end{pmatrix} + M\begin{pmatrix} y_b(k) \\ q(k) \end{pmatrix},$$

with TγM.

What is claimed is:

1. A multi-channel audio converter, comprising means for generating an audio signal from initial audio signals (x) and transforming means coupled to the transforming means for transforming said initial audio signals (x) to further audio signals (u), characterized in that transforming means comprise determining means for determining on basis of the initial audio signal (x), a dominant signal (y(k)) and one or more residue signals (q(k)), substantially transverse to each other, analyzing means (24) for analyzing frequency components of the dominant signal in at least two frequency ranges, forming a difference audio signal $(y_r\{y(k)-y_b(k))$ corresponding to the dominant signal (y(k)) minus a frequency range component of the dominant signal in one or more selected frequency ranges $(y_b(k))$, and means (25) for transforming the difference audio signal $(y(k)-y_b(k))$ and the residue signal (q(k)) into said further audio signals (u).

2. The multi-channel audio converter according to claim 1, characterized in that the transforming means comprise means (24) for forming a frequency range dominant signal $(y_b(k))$ corresponding to said frequency range component of the dominant signal $(y_b(k))$, and means for transforming the difference audio signal $(y_r\{y(k)-y_b(k))$, the frequency range dominant signal $(y_b(k))$ and the residue signal q(k) into said further audio audio signals (u), the transformation matrix (T,M) being different for the difference audio signal $(y(k)-y_B(k))$ than for the frequency range dominant signal $(y_b(k))$ (TγM).

3. The multi-channel audio convertor according to claim 1, characterized in that the transforming means comprise means (23) for forming from the initial audio signals (x) signal coefficient $(c_l, c_r, c'_c)$ for the transformation matrix (T) for the audio difference signal $(y_r)$.

4. The multi-channel audio converter according to claim 1, characterized in that the transformation means comprise means (26) for influencing the transformation matrix (M) for the frequency range dominant signal $(y_b(k))$.

5. The multi-channel audio converter according to claim 4, characterized in that the transformation means comprise means for influencing the apparent strength of the frequency range dominant signal $(y_b(k))$.

6. The multi-channel audio converter according to claim 4, characterised in that the transformation means comprise means for influencing the apparent position of the selected frequency range signal.

7. The multi-channel stereo converter according to claim 6, characterized in that the selected frequency range is from approximately 300 Hz to approximately 4 to 5 kHz.

8. The multi-channel stereo converter according to claim 1, characterized in that the selected frequency range is a flanked at both sides by non-selected frequency ranges.

9. Method for generation further audio signals (u) from initial audio signals (x) wherein an information signal $(c_l, c_r, c_s, c_c)$is derived from the initial audio signals and is used for transforming said initial audio signals (x) into said further audio signals (u), characterised in that on basis of the initial audio signal (x), a dominant signal (y(k)) and residue signal (q(k)), substantially transverse of each other, are determined, in at least two frequency ranges frequency components f the dominant signal are analyzed, a difference audio signal $(y_r)$ corresponding to the dominant signal (y(k)) minus a frequency range component of the dominant signal in one or more selected frequency ranges $(y_b(k))$ is formed and the difference signal $(y_r)$ and the residue signal (q(k)) are transformed in said further audio signal.

* * * * *